(12) United States Patent
Metzger et al.

(10) Patent No.: US 8,283,835 B2
(45) Date of Patent: Oct. 9, 2012

(54) GUIDED BULK ACOUSTIC WAVE DEVICE HAVING REDUCED HEIGHT AND METHOD FOR MANUFACTURING

(75) Inventors: Thomas Metzger, Munich (DE); Christoph Eggs, Rattenkirchen (DE); Werner Ruile, Munich (DE)

(73) Assignee: Epcos AG, Munich (DE)

( * ) Notice: Subject to any disclaimer, the term of this patent is extended or adjusted under 35 U.S.C. 154(b) by 197 days.

(21) Appl. No.: 12/771,407

(22) Filed: Apr. 30, 2010

(65) Prior Publication Data

US 2011/0266917 A1 Nov. 3, 2011

(51) Int. Cl.
*H01L 41/04* (2006.01)
(52) U.S. Cl. .................................. 310/313 A
(58) Field of Classification Search ............... 310/313 R, 310/313 A, 313 B, 313 C, 313 D
See application file for complete search history.

(56) References Cited

U.S. PATENT DOCUMENTS

| | | | |
|---|---|---|---|
| 7,151,424 B2 | 12/2006 | Kando | |
| 7,486,001 B2 | 2/2009 | Kando | |
| 7,522,020 B2 | 4/2009 | Kando | |
| 7,619,347 B1 * | 11/2009 | Bhattacharjee | 310/313 R |
| 2004/0036381 A1 * | 2/2004 | Abbott et al. | 310/313 R |
| 2005/0057323 A1 | 3/2005 | Kando | |
| 2006/0138902 A1 | 6/2006 | Kando | |
| 2008/0106354 A1 | 5/2008 | Kando | |
| 2009/0102318 A1 | 4/2009 | Kando | |
| 2011/0180391 A1 * | 7/2011 | Larson et al. | 204/192.18 |

FOREIGN PATENT DOCUMENTS

WO WO-2010/031924 A1 3/2010

OTHER PUBLICATIONS

"An American National Standard; IEEE Standard on Piezoelectricity," IEEE Standard on Piezoelectricity, 1988, pp. 1-74, ANSI/IEEE Std. 176-1987, The Institute of Electrical and Electronics Engineers, Inc., New York, New York, United States.

"Single Crystal Wafers for Surface Acoustic Wave (SAW) Device Applications—Specifications and Measuring Methods," IEC 62276—International Standard, May 2005, pp. 1-34, Edition 1.0, International Electrotechnical Commission, Geneva, Switzerland.

Kadota, M., et al., "4.5 GHz Lamb Wave Device Composed of $LiNbO_3$ Thin Film," Microwave Symposium Digest, Jun. 2009, pp. 333-336, MTT '09, IEEE MTT-S International, Boston, Massachusetts, United States.

* cited by examiner

*Primary Examiner* — Derek Rosenau
(74) *Attorney, Agent, or Firm* — Slater & Matsil, L.L.P.

(57) ABSTRACT

Guided bulk acoustic wave devices and method for manufacturing guided bulk acoustic wave devices are provided. A guided bulk acoustic wave device includes a resonator structure with a piezoelectric layer, an electrode layer for exciting guided bulk acoustic waves and a wave guide layer. The thickness of the piezoelectric layer is less than or equal to 50 μm.

23 Claims, 13 Drawing Sheets

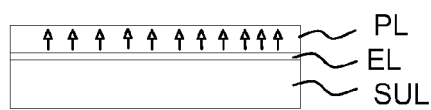
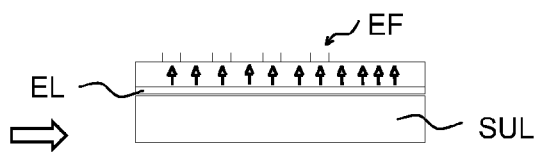
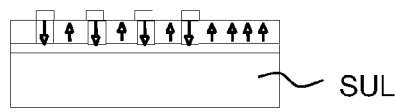
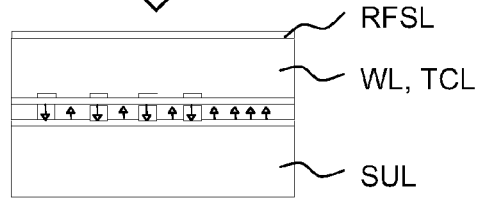
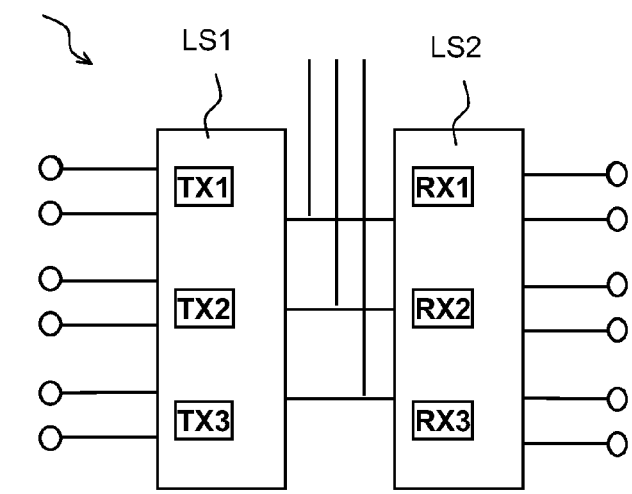

an electrode layer is arranged between the piezoelectric layer and the waveguide layer and the piezoelectric layer has a thickness less than or equal to 50 micrometer.

GUIDED BULK ACOUSTIC WAVE DEVICE HAVING REDUCED HEIGHT AND METHOD FOR MANUFACTURING

TECHNICAL FIELD

The present invention refers to devices working with guided bulk acoustic waves and having a reduced height and to methods for manufacturing such devices.

BACKGROUND

Devices working with guided bulk acoustic waves can be used in mobile communication devices. GBAW devices (GBAW=Guided Bulk Acoustic Wave) enable manufacturing of miniaturized and low-cost micro-acoustic filter systems for RF applications.

The present trend towards miniaturization and towards lower production costs of respective devices such as filters or duplexers create a demand for cheaper components with a reduced volume.

SAW devices working with frequencies higher than 3 GHz are known from the IEEE article "4.5 GHz Lamb wave device composed of $LiNbO_3$ thin film" by Michio Kadota, Takashi Ogami, Kansho Yamamoto, Yasuhiro Negoro, and Hikari Tochishita (IEEE, IMS 2009). A device includes z-axis orientated thin $LiNbO_3$ (lithium niobate) films.

Boundary acoustic wave devices are known from US patent application US 2005/0057323 A1. Such boundary acoustic wave devices include a laminate of a plurality of boundary acoustic wave elements. Within the laminate different resonant structures are glued on top of each other.

U.S. Pat. No. 7,522,020 B2, discloses boundary acoustic wave devices having a single crystal piezoelectric substrate and electrode structures of a first boundary acoustic wave device on its top surface and second electrodes of a second boundary acoustic wave device on its bottom surface.

Boundary acoustic wave devices using shear horizontal boundary acoustic waves are known from United States patent application US 2006/0138902 A1. Electrode fingers are arranged on a lithium niobate single crystal substrate. The electrodes are covered by a silicon dioxide layer. The silicon dioxide layer is covered by a sound absorbing layer including a resin.

The above-mentioned boundary acoustic wave devices utilize single crystal piezoelectric substrates in which acoustic waves are excited. However, manufacturing costs of single crystal piezoelectric substrates like $LiNbO_3$ (lithium niobate) are high. Further, the thickness of such single crystal substrates cannot be reduced according to modern demands for miniaturizing acoustic wave devices like bandpass filters or duplexers for mobile communication devices. Especially single crystals having a thickness of less than 100 µm cause problems during manufacturing when using large wafers of such crystals due to insufficient mechanical stability.

SUMMARY OF THE INVENTION

In one aspect, the present invention provides a GBAW device having a smaller volume that causes lower production costs and to provide a method for manufacturing such devices.

For example, a guided bulk acoustic wave device includes a substrate layer and a first layer stack arranged on the substrate layer. The first layer stack has a first resonator structure with a piezoelectric layer, a first electrode layer for exciting guided bulk acoustic waves, and a waveguide layer. The first

BRIEF DESCRIPTION OF THE DRAWINGS

The present invention will become fully understood from the detailed description given herein below and the accompanying schematic drawings. In the drawings

FIGS. 26*a*-26*e* show sagittal cross-sections of a GBAW device during the steps of domain inversion;

FIG. 27 shows a multiplexer for mobile communication devices having Tx filters in a first layer stack and having Rx filters in a second layer stack;

Figure 1:
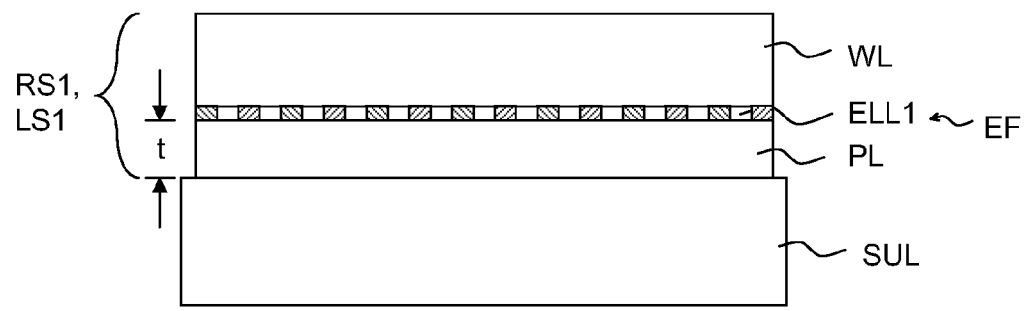
FIG. 1 shows a sagittal cross-section of a GBAW device.

The following list of reference symbols may be used in conjunction with the drawings:

AAL: acoustic absorption layer
BAW: bulk acoustic wave
BU: bump connection
BW: bond wire
CE: capacitance element
EF: electrode fingers
EL1, EL2: first, second electrode
ELL1: first electrode layer
ELL2: second electrode layer
GBAW: guided bulk acoustic wave
HKDL: high-k dielectric layer
IE: inductance element
IL: isolation layer
INC: internal connection
LKDL: low-k dielectric layer
LS1: first layer stack
LS2: second layer stack
ME: metallization
MEMS: micro-electromechanical system
PD: piezoelectric domain
PL: piezoelectric layer
RFSL: radio frequency shield layer
RS: rough surface
RS1: first resonator structure
RS2: second resonator structure
Rx: receive filter of a multiplexer
SL: seed layer
SUL: substrate layer
t: thickness of the piezoelectric layer
TCL: temperature compensation layer
TDL: thermal distribution layer
TH: through-hole
Tx: transmit filter of a duplexer
UC: unit cell of a piezoelectric material
WL: wave guide layer
α: angle between the piezoelectric axis and an axis normal to the piezoelectric layer

DETAILED DESCRIPTION

The present invention provides a GBAW device (GBAW=guided bulk acoustic wave) including a substrate layer and a first layer stack arranged on the substrate layer. The first layer stack has a first resonator structure. The first resonator structure has a piezoelectric layer, a first electrode layer for exciting guided bulk acoustic waves, and a wave guide layer. The first electrode layer is arranged between the piezoelectric layer and the wave guide layer. The piezoelectric layer has a thickness less than or equal to 50 µm.

In a GBAW device, bulk acoustic waves are excited. Therefore, electrode structures, e.g., electrode fingers of inter-digital transducers, excite the atoms of a piezoelectric layer due to the piezoelectric effect. These excited bulk acoustic waves are guided within a mainly horizontal resonator structure. Excited bulk acoustic waves can establish a standing wave within the resonator structure. The resonator structure can include the piezoelectric layer, an electrode layer with structured electrodes, a wave guide layer, and, optionally, reflector structures at longitudinal ends of an according acoustic track. Acoustic properties of the resonator structure like the density or the acoustic impedance of the piezoelectric layer, the electrode layer and the wave guide layer are chosen in such a way that the resonator structure forms a cavity, i.e., a means for propagation, for the bulk acoustic waves.

It is therefore novel to provide GBAW devices that utilize piezoelectric layers having a thickness <=50 µm. It is not a triviality to provide piezoelectric layers of such a reduced thickness as discussed below. During manufacturing of an according GBAW device, such a piezoelectric layer can be deposited by means of thin film deposition techniques.

Silicon wafers can be utilized as substrate layers. The resistivity of substrate layers may be at least 100 Ωcm. The diameter of the substrate wafers may be 200 mm. Other materials like glass are also possible for substrate wafers. Suitable thin film deposition techniques are, for example, PVD (Physical Vapor Deposition), CVD (Chemical Vapor Deposition), MBE (Molecular Beam Epitaxy), or LPE (liquid phase epitaxy). Such deposition techniques can cause low costs during production, e.g. if thicknesses of deposited film are small. Lithium niobate or lithium tantalate may include the piezoelectric layers. Epitactically grown thin films with only one ferroelectric domain within the piezoelectric layer may be preferred. The present invention can be suited for monolithic integration of radio frequency devices.

GBAW devices having such a thin piezoelectric layer have a reduced height compared to known boundary acoustic wave devices. Thus, the volume of an according device, e.g., a RF Filter or a duplexer, is reduced. This effect can be utilized to create GBAW devices with stacked resonator structures having a high integration density.

Figure 28:
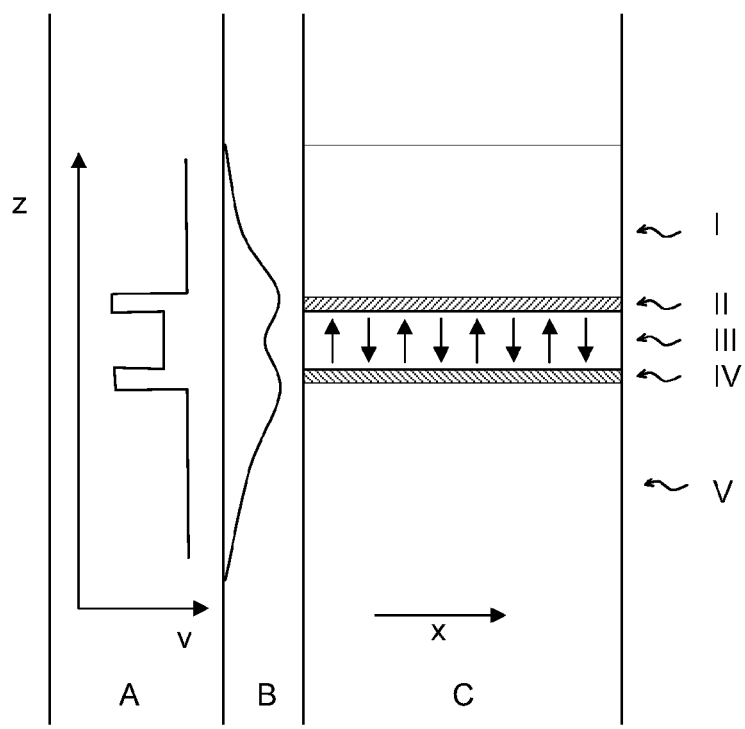
FIG. 28 shows a possible vertical profile of the horizontal velocity of GBAWs.
Figure 29:
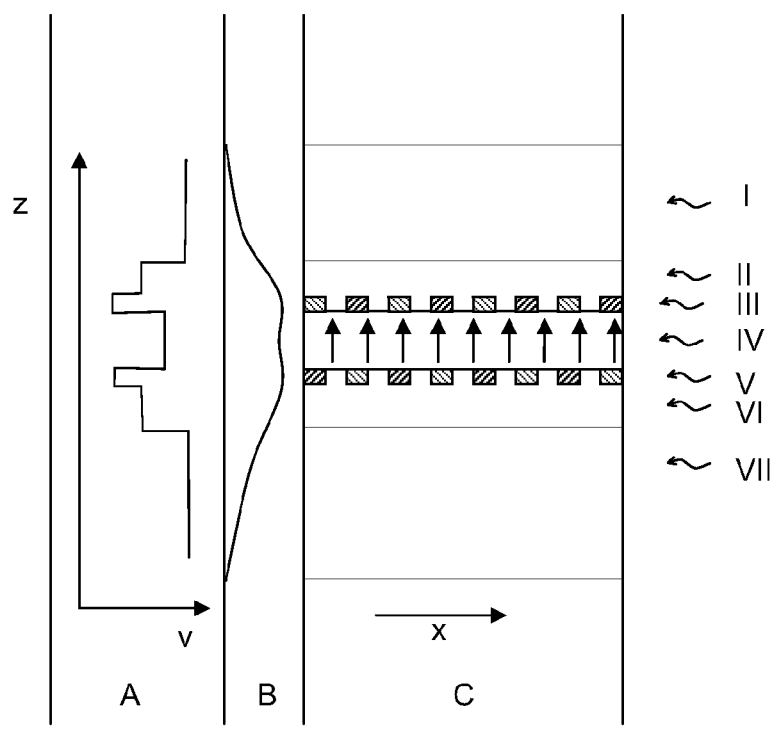
FIG. 29 shows another possible vertical profile of the horizontal velocity of GBAWs.

Some non limiting details concerning the guidance of GBAWs according to the present invention are shown in FIGS. 28 and 29.

In one embodiment of the guided bulk acoustic wave device, the first electrode layer includes two electrodes with inter-digitated electrode fingers. Inter-digitated electrode fingers are known from SAW devices (SAW=Surface Acoustic Wave). However, the technology of guided bulk acoustic wave devices significantly differs from SAW devices as SAW devices work with surface acoustic waves propagating at an interface region between a bulk material and a gas such as air or a vacuum. In contrast, GBAW devices work with bulk acoustic waves within the resonator structure having the piezoelectric layer and a wave guide layer. Thus, in general, interdigitated electrode fingers of GBAW devices differ from SAW interdigitated electrode fingers in detail.

However, inter-digitated electrode fingers can be utilized to excite bulk acoustic waves within the resonator structure. Therefore, the electrode fingers electromagnetically interact with the piezoelectric layer. The interaction depends on the orientation of the applied electric field of an RF signal and relative to the piezoelectric axis. This is the reason why thin film piezoelectric layers are unattractive for GBAW application. Without further care, GBAW devices with thin piezoelectric layers have, thus, a low coupling coefficient $\kappa^2$ although such GBAW devices do work.

In one embodiment, an angle between a piezoelectric axis of the piezoelectric layer and an axis perpendicular to the piezoelectric layer is between 5° and 15°.

The designer of a SAW device including a single crystal piezoelectric material is free in choosing the direction of propagation of the surface waves relative to the orientation of the piezoelectric substrate. However, when the piezoelectric layer for a GBAW device is provided otherwise than a single crystal in order to achieve a thickness less than or equal to 50 µm, the orientation of the direction of propagation of the guided bulk acoustic waves relative to the piezoelectric axis of the piezoelectric layer should be considered. The coupling coefficient $\kappa^2$ between the electric field and the piezoelectric material depends on the angle between the piezoelectric axis and the electric field. In an embodiment of the GBAW device having two electrodes with inter-digitated electrode fingers within one electrode layer, the direction of the electric field is mainly parallel to the direction of propagation of the bulk acoustic waves. The direction of propagation of the bulk acoustic waves is mainly parallel to the surface of the piezoelectric layer because the piezoelectric layer is part of the resonator structure. The electromagnetic coupling coefficient can, therefore, be increased by "tilting" the piezoelectric axis of the piezoelectric layer. Thus, a guided bulk acoustic wave device with an improved electromagnetic coupling coefficient $\kappa^2$ is gained.

In one embodiment, the first resonator structure further includes a second electrode layer. The piezoelectric layer is arranged between the first and the second electrode layer. The first electrode layer includes a first electrode and the second electrode layer includes a second electrode. In other words: the piezoelectric layer is sandwiched between the first and the second electrode layers. Such a GBAW device has a high electromagnetic coupling coefficient $\kappa^2$ even if the piezoelectric axis of the piezoelectric layer is normal to the piezoelectric layer. Then, the electric field and the piezoelectric axis are oriented mainly in parallel.

In one embodiment of such a sandwiched structure, the first electrode and the second electrode include electrode fingers. The electrode fingers can be inter-digitated electrode fingers. Dependent on the orientation, e.g., on a horizontal offset of the upper and the lower electrode fingers, guided bulk acoustic wave devices traveling along the resonator structure can be excited instead of bulk acoustic waves. It is possible, for example, to arrange the fingers of the upper electrode having a first polarity exactly above the respective electrode fingers of the lower electrode having an opposite polarity.

In an alternative embodiment of the sandwiched structure, the piezoelectric layer includes stripes of piezoelectric domains being arranged one next to another and having alternating orientations of the piezoelectric axis. In other words: the piezoelectric layers include stripes of inverted domains. Guided bulk acoustic waves instead of conventional bulk acoustic waves can then be gained without the need for structured electrode fingers. Planar extensive electrodes, a widespread lower electrode below the piezoelectric layer and an upper widespread electrode above the piezoelectric layer, can excite guided bulk acoustic waves propagating within the resonator structure by virtue of stripes of alternating piezoelectric domains. If such piezoelectric domains are arranged one next to another and have alternating orientations of the piezoelectric axis, then modes of standing guided bulk acoustic waves can be excited.

As already stated above, the wave guide layer is crucial for a GBAW device. Especially for a GBAW device having good characteristics. Good characteristics, e.g., good filter characteristics like steep passband skirts in passband filters, are gained by sharply defined wave modes propagating within the resonant structure.

Accordingly, in one embodiment of the guided BAW device, the wave guide layer includes $SiO_2$, SiN, $Al_2O_3$, TiN or a material having a ratio c/ρ which is higher than the ratio c/ρ of the material of the piezoelectric layer. Here, c is the material specific stiffness which may be a tensor. ρ is the density of the material measured in gram per cubic centimeter.

In one embodiment, the GBAW device further includes a seed layer being arranged directly below the piezoelectric layer. As the crystalline quality of the piezoelectric layer is crucial for good characteristics of the GBAW device, a seed layer can help creating a piezoelectric layer of good crystalline quality. This is even more important as the piezoelectric layer according to the present invention has a very low thickness and may be produced by virtue of thin film layer deposition techniques.

Accordingly, the seed layer may comprise Ti, Al, W, Cu, or Ag, or a combination thereof. The seedlayer may, e.g., include a 55 nm thick Ti layer, a 150 nm thick Al—Cu alloy layer, and a 150 nm thick W layer. The seed layer may help getting a good in-plane orientation or a good out-of-plane orientation of the piezoelectric layer.

In an embodiment of the GBAW device, the substrate layer includes monocrystalline or a poly-crystalline silicon or silicon or a material having a resistivity higher than 500 Ωcm and a thickness which provides a sufficient decay of the GBAW-mode. A thickness of three times the longitudinal GBAW wavelength may be sufficient. for example: a velocity v of the GBAW of approx. 4000 m/s and a designated frequency f of approx. 1 GHz yields a respective wavelength λ=v/f=4 µm. A respective sufficient thickness is, then, 12 µm or more.

GBAW devices including a thin piezoelectric layer do not need expensive single crystalline piezoelectric substrates. Instead, silicon or a silicon including material that may be well-known from semiconductor production and that is cheaper and mechanically more stable than, for example, $LiNbO_3$ may be utilized as a substrate layer. The resistivity of silicon mainly depends on its crystalline quality and elemental purity. Silicon having a resistivity that is higher than 500 Ωcm provides low dielectric losses and is, thus, well suited for microwave applications. Thus, the present invention is well suited for microwave applications.

It is, however, possible that an electrode in an electrode layer is arranged below the piezoelectric layer. Then, such a "bottom electrode" can be electrically connected to ground and the substrate below the grounded electrode is mainly free of electric fields. Then cheap wafers like cheap Si wafers can be utilized as substrates.

In one embodiment, the GBAW device further includes a temperature compensation layer. The temperature compensation layer is arranged above the piezoelectric layer. The TCF (TCF=Temperature Coefficient of Frequency) of a GBAW device depends on the TCF of the respective materials. That is, it depends on the material of the substrate, the piezoelectric layer, the electrode layer and the wave guide layer. A temperature compensation layer can counteract detrimental deviations of the frequency due to a temperature dependent variation of elastic constants which has a different sign compared to one of the respective other layers.

The temperature compensation layer may include silicon dioxide $SiO_2$ or tellurium dioxide $TeO_2$.

However, it is also possible to arrange the temperature compensation layer or another temperature compensation layer below the piezoelectric layer or below a "bottom electrode" below the temperature compensation layer.

The temperature compensation layer may be arranged between the piezoelectric layer and the wave guide layer. The temperature compensation layer may be arranged between the electrode layer and the wave guide layer. The temperature compensation layer may be arranged above the wave guide layer. The temperature compensation layer may even represent the wave guide layer. As the wave guide layer is part of the resonator structure for the guided bulk acoustic waves, a tradeoff has to be chosen whether the wave guide layer has temperature compensation characteristics, too, or whether the wave guide layer is better optimized in its wave guiding properties.

In one embodiment, the GBAW device further includes an acoustic absorption layer being arranged above or below the resonator structure. The acoustic absorption layer may include BCB (Benzocyclobutene). The acoustic absorption layer helps in isolating the resonator structure from acoustically interacting with the GBAW devices' environment, thus reducing or preventing acoustic crosstalk and unwanted spurious signals.

In one embodiment, the GBAW device further includes an RF shield layer including a metal. The layer stack of the GBAW device can be fully or at least partially covered by the shield layer. Thus, electromagnetic coupling between the GBAW device and a radiating or radiation sensitive environment is reduced.

In one embodiment, the GBAW device includes a thermal distribution layer. The thermal distribution layer can be a layer of a material having high thermal conductivity, e.g., the conductivity of diamond, being embedded within the layer stack. Then, heat generated by acoustic wave dissipation is conducted out of the device and the effect of a thermally induced shift of the resonance frequency is reduced or removed.

In one embodiment, the GBAW device further includes a high-k dielectric layer with an integrated capacitive element. An according integrated capacitive element can include a first electrode and a second electrode being arranged in parallel to the first electrode. The capacity of such a capacitor is reciprocal to the distance of the electrodes and proportional to the dielectric constant k of the dielectric layer between the capacitive element. Thus, high-k dielectric layers enable capacitive elements with high capacity. The dielectric constant k may be between 10 and 80.

In one embodiment, the GBAW device further includes a low-k dielectric layer with an integrated inductive element. The inductance of an inductive element depends on the environment of the inductive element. If the environment includes a low-k dielectric layer then the inductance of the integrated inductive element is increased. The dielectric constant k may be between 3 and 4, e.g., if the low-k dielectric layer includes BCB. If the low-k dielectric layer includes $SiO_2$ then k may be approx. 3.9.

Thin film deposition techniques can be utilized not only for creating a good piezoelectric thin layer but can also for depositing dielectric layers with high or low dielectric constants k and also for depositing structured elements like electrodes or conducting structures of capacitive or inductive elements.

In one embodiment, the GBAW device further includes a second resonator structure with a piezoelectric layer, a first electrode layer for exciting guided bulk acoustic waves, and a wave guide layer. The second resonator structure is arranged within the first layer stack above the first resonator structure.

Such a GBAW device benefits from a thin piezoelectric layer twice. In contrast to known boundary acoustic wave devices, no glue is needed to connect different single-crystal substrates. No volume is "wasted" by thick single-crystal substrates as all the layers of the present multi-layered GBAW device can be deposited sequentially on top of each other by thin film deposition techniques.

In one embodiment, the GBAW device further includes a second layer stack including a resonator structure with a piezoelectric layer, a first electrode layer for exciting guided bulk acoustic waves, and a wave guide layer. The first and the second layer stack are arranged above the substrate layer laterally adjacent to each other.

Such a GBAW device has a high vertical integration density due to their stacked thin film structure within each layer stack and, as well, a high horizontal integration density by arranging stacks of high integration density adjacent and close to each other. The individual layers of the individual layer stacks can be deposited simultaneously using thin film deposition techniques creating a highly integrated GBAW device without the need of additional deposition steps for adjacent stacks.

As according layer stacks are arranged adjacent to but separate from each other, the acoustic coupling between the stacks is further reduced. If, for example, the GBAW device includes a duplexer where a first duplexer filter is embedded within the first layer stack and a second duplexer filter is embedded within the second layer stack then the isolation between the first filter and the second filter is enhanced.

Accordingly, in one embodiment the GBAW device includes a Tx filter (=transmission filter) of a duplexer in the first layer stack and an Rx filter (=receiving filter) of the duplexer in the second layer stack.

In another aspect of the invention, a GBAW device includes a substrate layer and a layer stack arranged on the substrate layer. The layer stack has a first resonator structure with a piezoelectric layer, an electrode layer for exciting guided bulk acoustic waves, and a wave guide layer. Further, the layer stack has a second resonator structure with a piezoelectric layer, a first electrode layer for exciting guided bulk acoustic waves, and a wave guide layer. The second resonator structure is arranged above the first resonator structure. The piezoelectric layer of the first resonator structure or the piezoelectric layer of the second resonator structure has a thickness $<=50$ µm.

In another aspect of the invention, a guided bulk acoustic wave device includes a substrate layer and a layer stack arranged on the substrate layer. The layer stack has a resonator structure with a piezoelectric layer, an electrode layer for exciting guided bulk acoustic waves, and a waveguide layer. The electrode layer is arranged between the piezoelectric layer and the waveguide layer. The piezoelectric layer includes stripes of piezoelectric domains being arranged one next to another and having alternating orientations of the piezoelectric axes.

In another aspect of the invention, a guided bulk acoustic wave device includes a substrate layer and a layer stack arranged on the substrate layer. The layer stack has a first resonator structure with a piezoelectric layer, an electrode layer for exciting guided bulk acoustic waves, and a waveguide layer. The layer stack, further, has a second resonator structure with a piezoelectric layer, an electrode layer for exciting guided bulk acoustic waves, and a waveguide layer. The second resonator structure is arranged above the first resonator structure. The piezoelectric layer of the first or second resonator structure includes stripes of piezoelectric domains being laterally arranged one next to another and having alternating orientations of the piezoelectric axes.

Another aspect of the present invention refers to a method for manufacturing a guided bulk acoustic wave device. A piezoelectric layer is deposited onto a substrate layer by means of thin film layer deposition. An upper electrode layer is deposited onto the piezoelectric layer. An electrode is structured by structuring the electrode layer. A wave guide layer is deposited onto the electrode layer.

In one embodiment, a lower electrode layer is deposited onto the substrate layer before depositing the piezoelectric layer. Electrode fingers are structured within the lower electrode layer and within the upper electrode layer stripes of piezoelectric domains are formed within the piezoelectric layer by applying an electric field via the structured electrode fingers and by heating the piezoelectric layer.

Various embodiments will now be described with respect to the figures.

FIG. 1 shows a cross-section of a GBAW device having a first resonator structure RS1 within a first layer stack LS1 being arranged on a substrate layer SUL. The resonator structure RS1 includes a piezoelectric layer PL and a wave guide layer WL. Between the piezoelectric layer PL and the wave guide layer WL, a first electrode layer ELL1 is arranged. The first electrode layer ELL1 includes electrode fingers EF. Two kinds of hatchings of the electrode fingers EF indicate that adjacent electrode fingers belong to different ones of two electrodes having opposite polarity.

The thickness t of the piezoelectric layer PL is less than or equal to 50 µm. The piezoelectric layer PL, the first electrode layer ELL1 including finger electrodes, and the waveguide layer WL establish a resonator structure in which guided bulk acoustic waves (GBAW) can propagate in a horizontal direction. The direction of propagation of the GBAWs is parallel to the surface of the piezoelectric layer and normal to the extension of the electrode fingers of which cross-sections are shown in FIG. 1.

An electrode layer including the electrodes of the GBAW device can be arranged between a top surface of the piezoelectric layer PL and a bottom surface of the wave guide layer WL. As electrode fingers of different electrodes must not be in contact with each other, otherwise a short circuit would be the result, the volume between the electrode fingers can be empty, filled with gases such as air or a bulky filler material. However, it is also possible that the electrode structures of the electrode layer is fully or at least partially embedded within the piezoelectric layer PL or within the wave guide layer WL. Then, the piezoelectric layer may be in direct contact with the wave guide layer.

Figure 2:
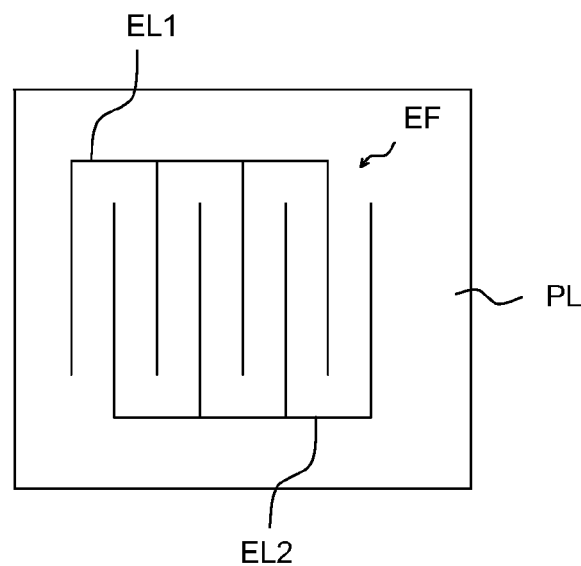
FIG. 2 shows a transverse, i.e. in-plane, cross-section of a GBAW device.

FIG. 2 shows a transverse cross-section, e.g. a top view, of an electrode layer of a GBAW device. Electrode fingers EF of a first electrode EL1 and of a second electrode EL2 are arranged on a piezoelectric layer PL. The distance between the centers of adjacent electrode fingers mainly determines the half wavelength $\lambda/2$ of the excited guided bulk acoustic wave. The comb shaped electrode EL1 of the first electrode EL1 and the comb shaped electrode EL2 are conventionally known as inter-digitated electrodes.

Figure 3:
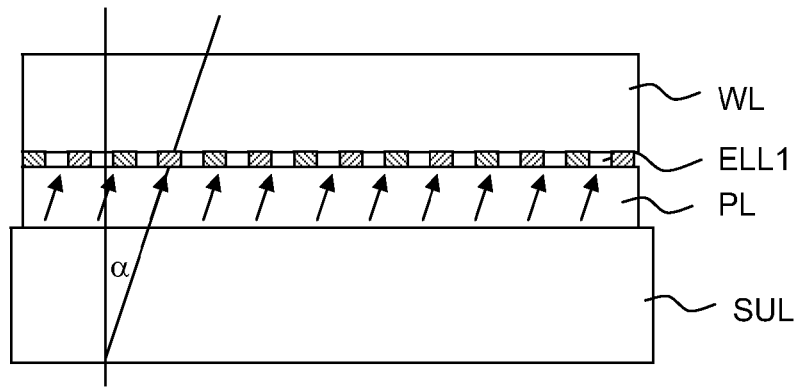
FIG. 3 shows a sagittal cross-section of a GBAW device having a piezoelectric layer with a tilted piezoelectric axis.

FIG. 3 shows a sagittal cross-section of a GBAW device having a piezoelectric layer PL being sandwiched between a first electrode layer ELL1 and a substrate layer SUL. Arrows within the piezoelectric layer indicate the orientation of the piezoelectric axis of the piezoelectric material. The piezoelectric axis is tilted. The angle between the piezoelectric axis and an axis normal to the piezoelectric layer PL is denoted as $\alpha$. $\alpha$ may be in the range between 1° and 89°; especially, $\delta$ may be between 5° and 15°; $\alpha$ may be 10°.

Figure 4:
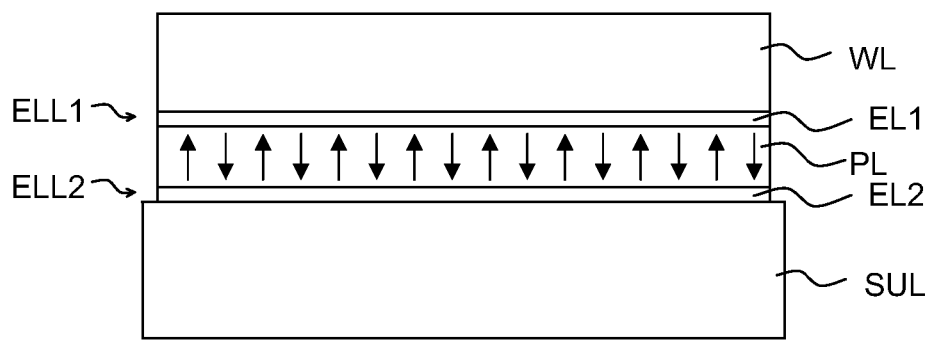
FIG. 4 shows a sagittal cross-section of a GBAW device having a piezoelectric layer sandwiched between two electrode layers and having stripes of piezoelectric domains being arranged one next to another and having alternating orientations of the piezoelectric axis.

FIG. 4 shows a sagittal cross-section of a GBAW device having a piezoelectric layer PL that is sandwiched between a first electrode layer ELL1 and a second electrode layer ELL2. The first electrode layer is arranged between a wave guide layer WL and the piezoelectric layer PL. The second electrode layer ELL2 is arranged between the piezoelectric layer PL and the substrate layer SUL. The first electrode layer ELL1 includes a first electrode EL1. The second electrode layer ELL2 includes a second electrode EL2. In contrast to FIG. 3, the GBAW device in FIG. 4 includes two electrode layers.

Further, the GBAW device of FIG. 4 may include inter-digitated electrode fingers or widespread, i.e., extensive or large-area electrodes as known from BAW resonator structures. Arrows within the piezoelectric layer PL indicate areas, e.g., laterally adjacent stripes, of opposite orientations of the piezoelectric axis. If a radio frequency signal is applied to the first and to the second electrodes EL1, EL2, then a standing bulk acoustic wave is excited within the resonator structure on the substrate layer SUL. Conventional GBAW devices need reflector structures at the longitudinal ends of the acoustic track. However, FIG. 4 illustrates an embodiment of a GBAW device in which reflector structures are not necessarily needed in order to get a standing acoustic wave.

Figure 5:
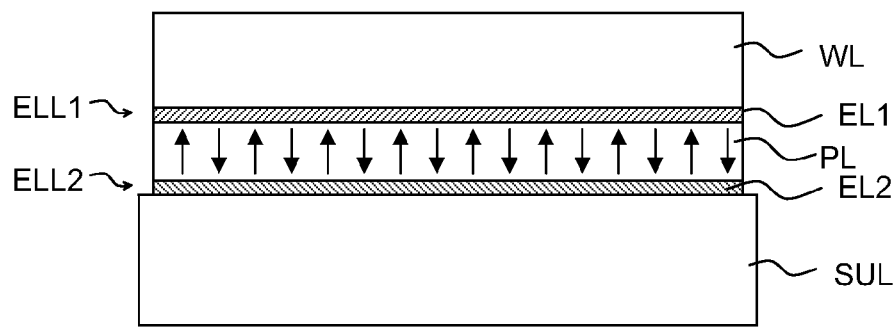
FIG. 5 shows a sagittal cross-section of a GBAW device having stripes of piezoelectric domains of alternating orientations and two extensively shaped electrodes sandwiching the piezoelectric layer.

FIG. 5 shows a sagittal cross-section of a GBAW device having two electrode layers ELL1, ELL2 sandwiching the piezoelectric layer PL. Two kinds of hatchings of the electrode layers ELL1, ELL2 indicate that adjacent electrode fingers belong to different of two electrodes EL1, EL2 having opposite polarity. As the piezoelectric layer PL includes areas of different orientation of the piezoelectric axis, as indicated by the arrows, different embodiments of the geometrical shape of the electrodes EL1, EL2 within the electrode layers are possible.

Figure 6:
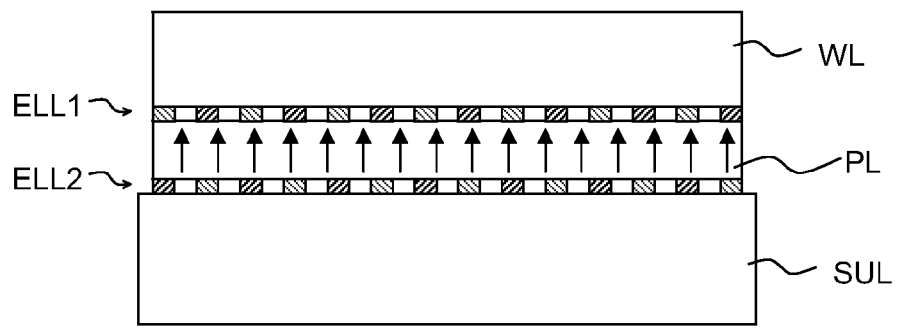
FIG. 6 shows a sagittal cross-section of a GBAW device having inter-digitated electrode fingers in two different electrode layers.

FIG. 6 shows a sagittal cross-section of a GBAW device according to another embodiment of the electrodes within the two electrode layers ELL1, ELL2. In contrast to FIG. 5, the piezoelectric layer PL includes one homogenous domain of the piezoelectric axis. However, the two electrode layers ELL1, ELL2 each include inter-digitated electrode fingers where electrode fingers of opposite polarization, see the different hatchings, are arranged opposite to each other. Thus, it is possible to excite a standing guided bulk acoustic wave within the resonator structure.

Figure 7:
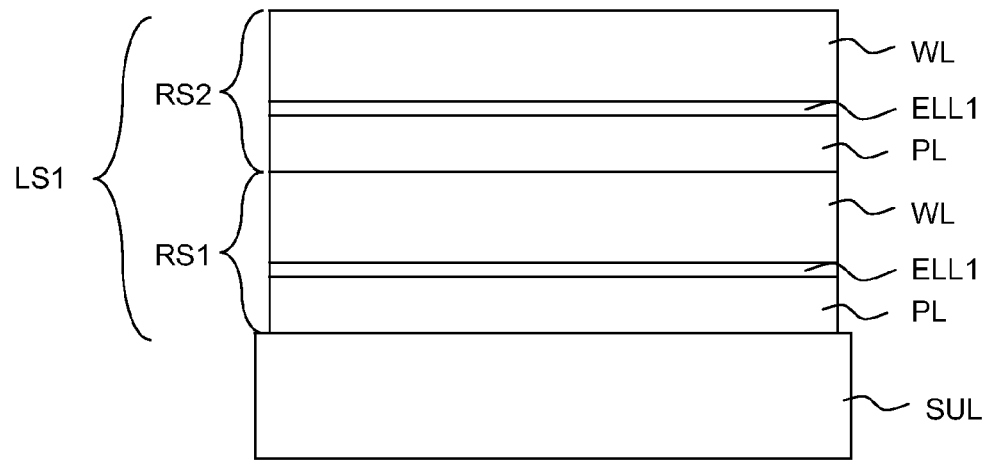
FIG. 7 shows a sagittal cross-section of a GBAW device having a second resonator structure stacked on a first resonator structure.

FIG. 7 shows a sagittal cross-section of a GBAW device including a first layer stack LS1 being arranged on the substrate layer SUL. The first layer stack LS1 includes a first resonator structure RS1 and a second resonator structure RS2. The first resonator structure RS1 is arranged on the substrate layer SUL. The second resonator structure RS2 is arranged on the first resonator structure RS1. Thus, the first resonator structure RS1 is sandwiched between the second resonator structure RS2 and the substrate layer SUL. Each of the resonator structures RS1, RS2 includes a piezoelectric layer PL, a first electrode layer ELL1 and a wave guide layer WL. The piezoelectric layer PL of the second resonator structure RS2 is arranged above the wave guide layer WL of the first resonator structure RS1. At least one of the piezoelectric layers PL has a thickness thinner than or equal to 50 µm. Thus, the respective GBAW device has a reduced height. If both piezoelectric layers PL have a thickness of less than 50 µm, then the overall height of the GBAW device is further reduced. Thin film deposition techniques are suited to deposit the layers of the resonator structures in a cost efficient manner.

Figure 8:
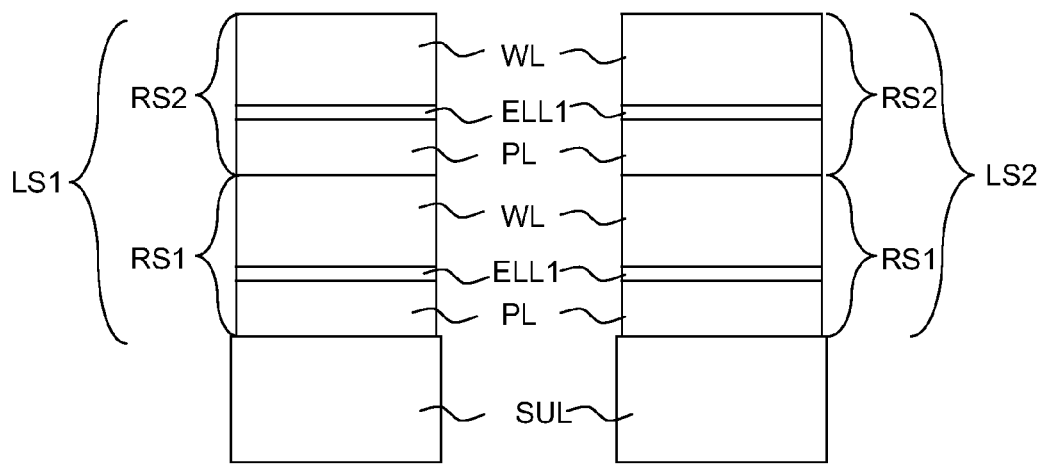
FIG. 8 shows a sagittal cross-section of a GBAW device having two layer stacks being arranged adjacent to each other.

FIG. 8 shows a sagittal cross-section of a GBAW device including two layer stacks LS1, LS2. The layer stacks LS1, LS2 are arranged adjacent to but separate from each other. They may be arranged on the same substrate layer SUL. However, it is possible that each layer stack LS1, LS2 is arranged on its own substrate layer SUL. Then, the respective substrate layers SUL may be arranged on a common carrier substrate. Each of the layer stacks LS1, LS2 includes a first resonator structure RS1 and a second resonator structure RS2 being arranged on the respective first resonator structure RS1.

However, it is possible to arrange different resonator structures adjacent to each other within the same layer stack.

Layers of separate layer stacks can be deposited together. After deposition, by structuring steps including etching methods deposited material between the layer stacks can be removed.

Figure 9:
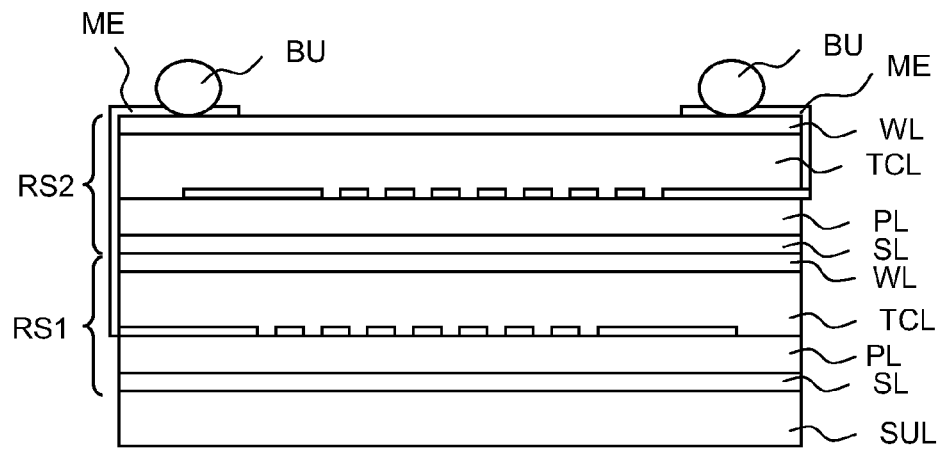
FIG. 9 shows a sagittal cross-section of a GBAW device having two resonator structures stacked onto each other where the resonator structures are electrically connected.

FIG. 9 shows a sagittal cross-section of a GBAW device having a second resonator structure RS2 arranged on top of a first resonator structure RS1. The first resonator structure RS1 is sandwiched between the second resonator structure RS2 and the substrate layer SUL. Each of the resonator structures RS1, RS2 includes a seed layer SL on which the piezoelectric layer PL is arranged. The respective seed layer SL supports growing of the piezoelectric layer PL according to a preferred orientation of the piezoelectric axis. A temperature compensation layer TCL is arranged between the piezoelectric layer PL carrying electrode structures and the wave guide layer WL. The electrode structures of the first resonator structure RS1 are electrically connected to the top side of the device and one or more bumps BU arranged there by means of a metallization ME being arranged on the (left) flank and on the top side of the layer structure. The electrode structures of the second resonator structure RS2 are electrically connected to at least one bump BU by means of a metallization ME being arranged on another flank (in the figure the right flank) of the layer structure.

A temperature compensation layer TCL helps reduce the detrimental effects of varying temperature on the temperature dependence of the center frequency of an according RF filter device.

Figure 10:
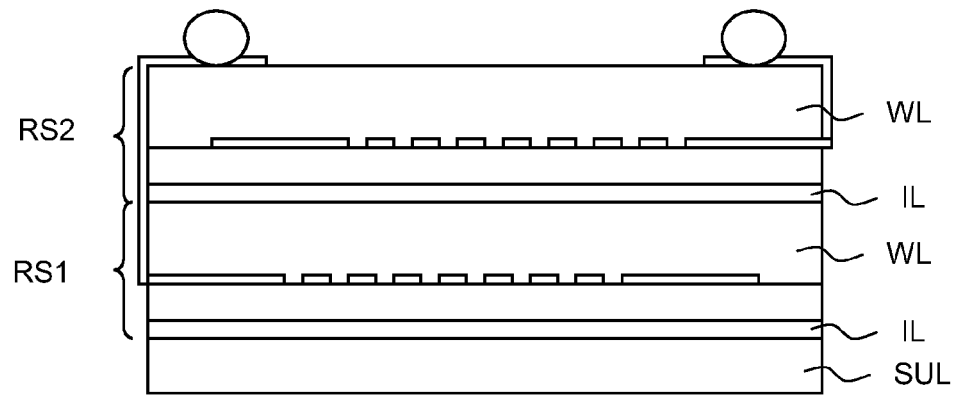
FIG. 10 shows a sagittal cross-section of a GBAW device having a second resonator structure stacked on a first resonator structure.

FIG. 10 shows a sagittal cross-section of a GBAW device including an isolation layer IL in each of the resonator structures RS1, RS2. The isolation layer IL may have a high electric resistivity and provides good electrical insulation. Thus, a cheap substrate layer SUL having a relatively low electric resistivity can be utilized in order to get a low cost device. The device of FIG. 10 includes a good electric insulation between the two resonator structures RS1, RS2 and between the electrode structures and an external environment.

It is, however, possible to achieve a good isolation between different layers, e.g., between the first and the second resonator structure RS1, RS2, by an electric shield. For example, the isolation layer IL can have a high electric permittivity $\in$. Such an isolation layer may have a high resistivity.

But conductive layers can act as electric shields, too. It is, thus, possible that one or more isolation layers IL have a high conductivity and include a metal. Metal layers can be utilized to shield electric fields. Then, one or more piezoelectric layers are sufficient to establish a good electric isolation against electric fields between different stacked resonator structures.

Figure 11A:
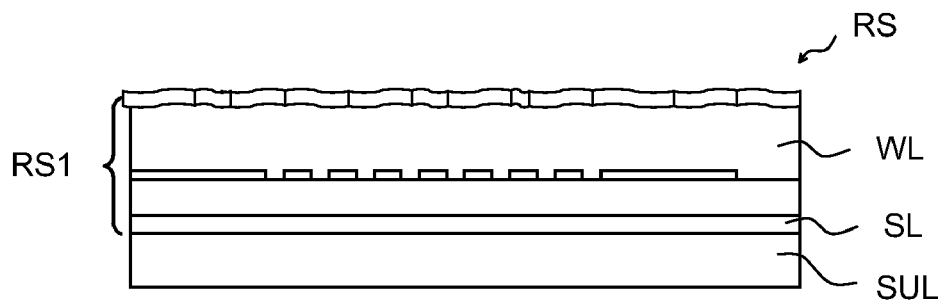
FIGS. 11a-11c show sagittal cross-sections of layer stacks indicating process steps during stacking.
Figure 11B:
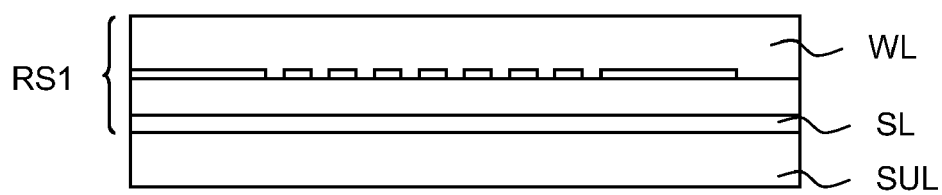
Figure 11C:
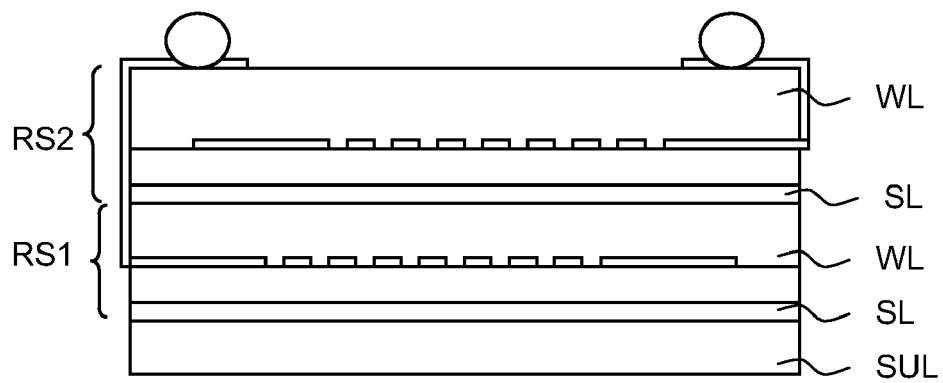

FIGS. 11a, 11b and 11c show steps of stacking second resonator structures RS2 onto the first resonator structure RS1. FIG. 11a shows a first resonator structure RS1 including a substrate layer SUL and a seed layer SL. The piezoelectric layer, the electrode layer and the wave guide layer are arranged onto the seed layer SL. The wave guide layer WL has a rough surface RS. Before depositing a second resonator structure RS2 onto the first resonator structure RS1, the top surface of the wave guide layer WL has to be flattened. Therefore, a resist layer can be deposited onto the rough surface of the wave guide layer WL. The resist layer can have the same etching rate as the wave guide layer WL. The resist layer can be spun onto the wave guide layer to provide a smooth and flat surface. In an etching step, the resist layer and part of the wave guide layer WL are removed. As the etch rate of the resist layer and of the wave guide layer WL are equal, the etched surface of the remaining wave guide layer WL will be smooth and flat, too.

FIG. 11b shows the first resonator structure RS1 after the flattening process. The waveguide layer WL has a flat and smooth surface.

Onto the flat surface of the wave guide layer WL of the first resonator structure RS1, a seed layer SL of the second resonator structure RS2 can be deposited followed by deposition of the remaining layers of the second resonator structure RS2. This is shown in FIG. 11c. Thus, a GBAW device is gained in which the respective layers have smooth interfaces and, due to a seed layer, a good crystalline quality.

The wave guide layer can be or act as a temperature compensation layer. Further, the wave guide layer of the lower resonator structure can be the seed layer of the upper resonator structure.

Figure 12:
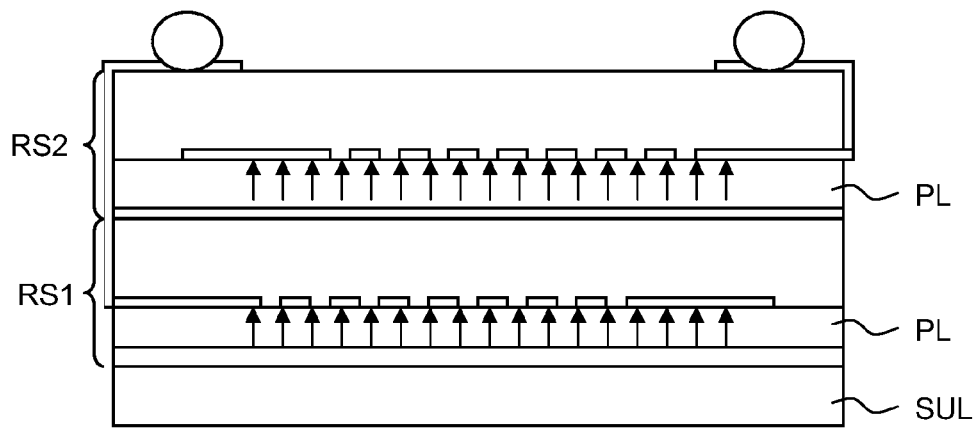
FIG. 12 shows a sagittal cross-section of a GBAW device having a layer stack of two resonator structures wherein each piezoelectric layer has a vertically oriented piezoelectric axis.

FIG. 12 shows a GBAW device including a first resonator structure RS1 and a second resonator structure RS2 being arranged on top of the first resonator structure RS1. Both resonator structures RS1, RS2 each include a piezoelectric layer PL with the piezoelectric axis being normal to the piezoelectric layer.

Figure 13:
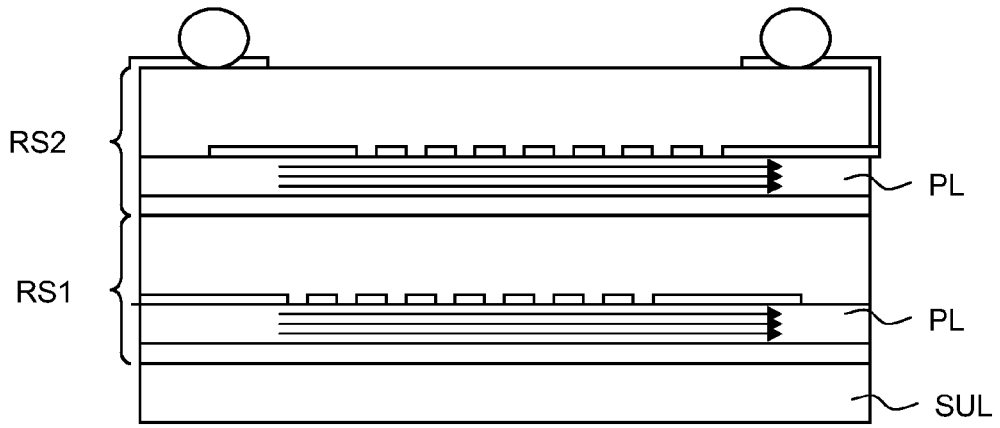
FIG. 13 shows a sagittal cross-section of a GBAW device having two resonator structures stacked on each other wherein each piezoelectric layer has a horizontally aligned piezoelectric axis.

FIG. 13 shows a sagittal cross-section of a GBAW device including a second resonator structure RS2 being arranged on top of a first resonator structure RS1. Both, the first resonator structure RS1 and the second resonator structure RS2 include a piezoelectric layer in which the piezoelectric axis, as indicated by arrows, is aligned parallel to the direction of propagation of the guided bulk acoustic waves. Thus, the piezoelectric axis is aligned parallel to the piezoelectric layer and normal to the electrode fingers whose cross-section can be seen in FIG. 13.

As the direction of the electric field applied to the interdigitated electrode fingers of the first and the second resonator structure RS1, RS2 is parallel or anti-parallel with respect to the direction of propagation of the guided bulk acoustic waves, the direction of the electric field is parallel or anti-parallel relative to the piezoelectric axis. In this orientation, the electromagnetic coupling coefficient $\kappa^2$ is maximal.

Figure 14:
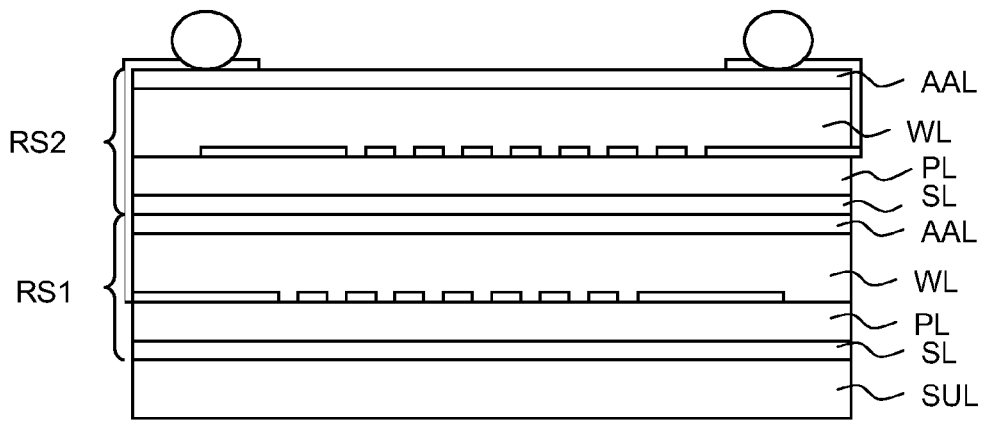
FIG. 14 shows a sagittal cross-section of a GBAW device having an acoustic absorption layer and a seed layer in each of two resonator structures.

FIG. 14 shows a sagittal cross-section of a GBAW device having a second resonator structure RS2 being arranged on a first resonator structure RS1. The first resonator structure RS1 includes a seed layer SL between the piezoelectric layer PL and a substrate layer SUL. Between the wave guide layer WL of the first resonator structure RS1 and the seed layer SL of the second resonator structure RS2, an acoustic absorption layer AAL of the first resonator structure RS1 is arranged. Further, above the wave guide layer WL of the second resonator structure RS2, an acoustic absorption layer AAL of the second resonator structure RS2 is arranged. Acoustic absorption layers can help to isolate resonator structures acoustically from other resonator structures or from a surrounding environment. Thus, acoustic crosstalk and spurious signals can be reduced or even suppressed. As a result, filter characteristics of respective filters including such GBAW devices are improved. An acoustic absorption layer can comprise BCB (Benzocyclobutene).

Figure 15:
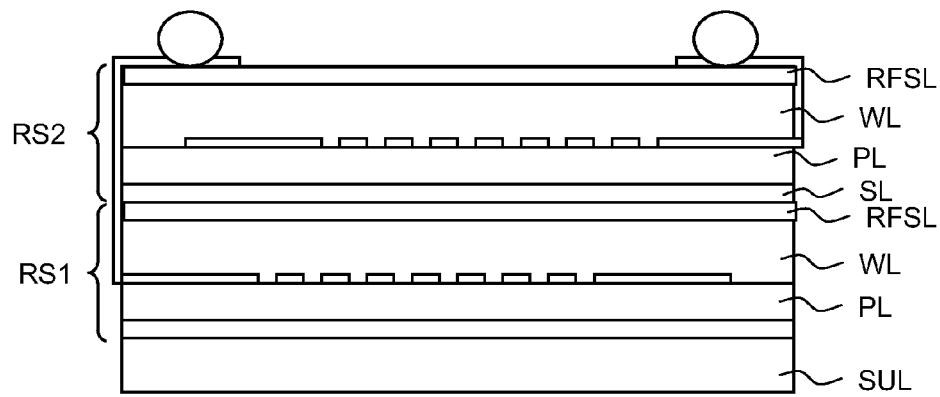
FIG. 15 shows a sagittal cross-section of a GBAW device having a seed layer and an RF shield layer within each of two resonator structures.

FIG. 15 shows a sagittal cross-section of a GBAW device including an RF shield layer RFSL within the first resonator structure RS1 and another RF shield layer within the second resonator structure RS2. The respective RF shield layer RFSL is arranged between the wave guide layer WL of the first resonator structure RS1 and the seed layer of the second resonator structure RS2. The RF shield layer RFSL of the second resonator structure RS2 is arranged above the wave guide layer WL of the second resonator structure RS2.

Figure 16:
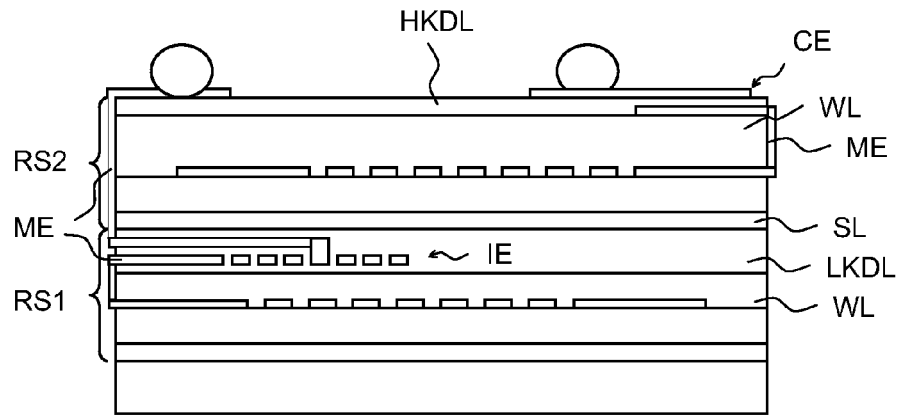
FIG. 16 shows a sagittal cross-section of a GBAW device having a low-k dielectric layer and an integrated inductive element in a first resonator structure and having a high-k dielectric layer with an integrated capacitive element in a second resonator structure.

FIG. 16 shows a sagittal cross-section of a GBAW device including a first resonator structure RS1 and a second resonator structure RS2. The first resonator structure RS1 includes a dielectric layer LKDL having a low-k dielectric constant. This low-k dielectric layer LKDL is arranged above the wave guide layer WL of the first resonator structure RS1. The low-k dielectric layer LKDL of the first resonator structure RS1 is arranged between the wave guide layer WL of the first resonator structure RS1 and the seed layer SL of the second resonator structure RS2. Within the low-k dielectric layer LKDL, electrode structures forming an inductive element IE are arranged. One electrode of the inductive element IE is electrically connected to the electrode structures of the first resonator structure RS1 by means of a metallization ME. The second electrode of the inductance element IE is electrically connected to a bump connection on the top surface of the GBAW device by means of a metallization ME. Above the wave guide layer WL of the second resonator structure RS2, a dielectric layer HKDL having a high dielectric constant k is arranged. Metallization structures above the wave guide layer WL of the second resonator structure and above the high-k dielectric layer HKDL form a capacitive element CE. One electrode of the capacitive element CE is electrically connected to electrode structures of the second resonator structure. The other electrode of the capacitive element CE is electrically connected to a bump on the top surface of the GBAW device.

Low-k dielectric layers allow forming embedded inductive elements having a high inductance while dielectric layers with a high dielectric constant k allow the creation of a capacitive element having a high capacity.

Figure 17:
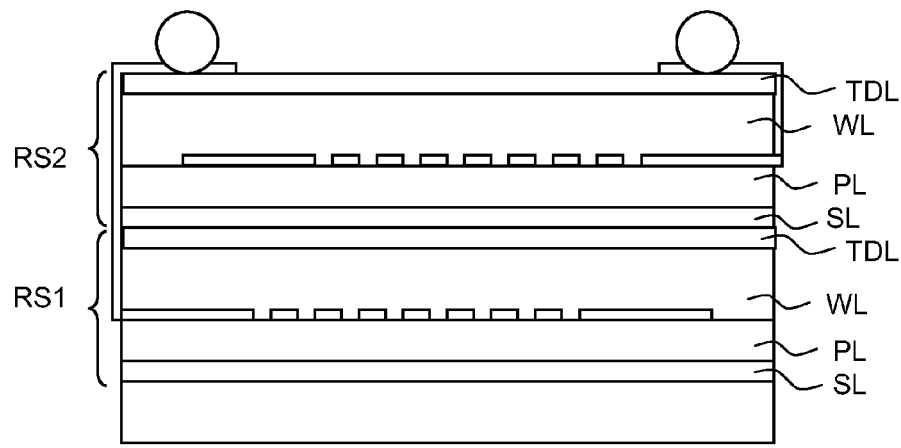
FIG. 17 shows a sagittal cross-section of a GBAW device having a seed layer and a thermal distribution layer within each of two resonator structures.

FIG. 17 shows a sagittal cross-section of a GBAW device having a first resonator structure RS1 with a thermal distribution layer TDL and a second resonator structure RS2 with a thermal distribution layer TDL. The thermal distribution layer TDL of the first resonator structure RS1 is arranged between the wave guide layer WL of the first resonator structure and the seed layer SL of the second resonator structure RS2. The thermal distribution layer TDL of the second resonator structure RS2 is arranged above the wave guide layer WL of the second resonator structure RS2. The thermal distribution layers TDL can help removing heat generated by a dissipated acoustic energy. As changes in temperature within GBAW devices are generally unwanted, thermal distribution layers can help keep the temperature during operation at a moderate level. Thus, temperature-induced shifts of frequency characteristics are reduced.

Figure 18:
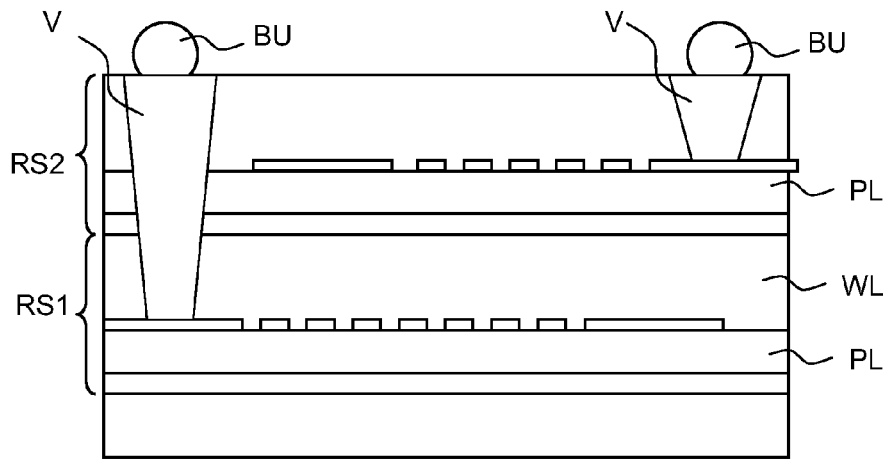
FIG. 18 shows a sagittal cross-section of a GBAW device having vias electrically connecting electrodes of two stacked resonator structures with bump connections on a top side on the device.

FIG. 18 shows a GBAW device including a first resonator structure RS1 and a second resonator structure RS2. Electrode structures of the first resonator structure RS1 are electrically connected to a bump BU on the top side of the device by means of a via connection V. Electrode structures of the second resonator structure RS2 are electrically connected to another bump connection BU by means of another via connection V. The via connection V connecting the bump BU and the electrode structures of the first resonator structure RS1 goes through the wave guide layer of the first resonator structure RS1 and through the layers of the second resonator structure RS2. The via connection V connecting the bump BU and the electrode structures of the second resonator structure RS2 goes through the wave guide layer WL of the second resonator structure RS2.

Figure 19:
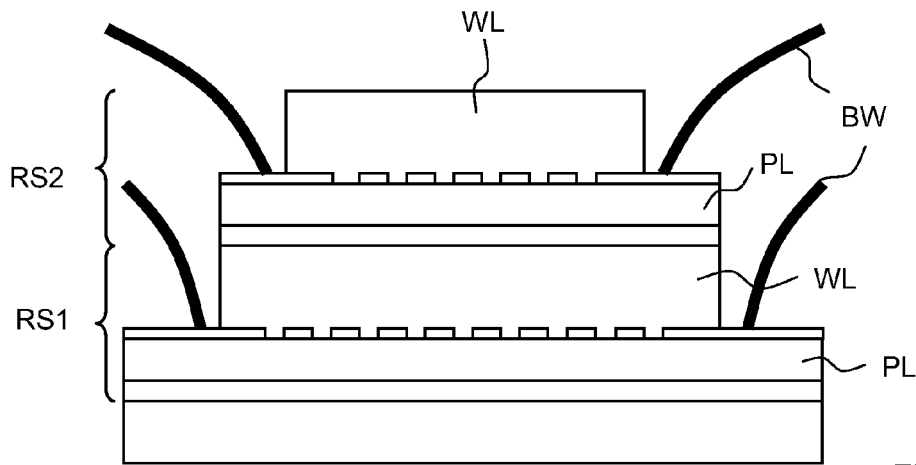
FIG. 19 shows a sagittal cross-section of a GBAW device in which electrodes of two different stacked resonator structures are electrically connected by bond wires.

FIG. 19 shows a sagittal cross-section of a GBAW device including a first resonator structure RS1 and a second resonator structure RS1. Electrode structures within electrode layers of the first RS1 and the second RS2 resonator structure are electrically connected by means of bond wires BW. The stack of resonator structure RS1, RS2 of the GBAW device each form a mesa like stack. The second mesa stack is arranged above the first mesa stack of resonator structures. Therefore, parts of the electrode structures of the resonator structures RS1 and RS2 are exposed to the environment, i.e., are accessible for bond wires, and can be connected via bond wires.

Figure 20:
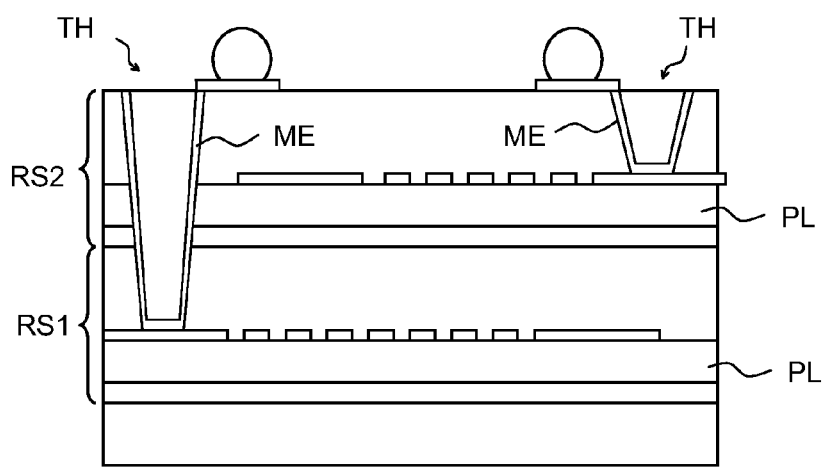
FIG. 20 shows a sagittal cross-section of a GBAW device in which electrodes of resonator structures are electrically connected to connection pads on a top side by means of throughholes with an electrically connecting metallization, the connection pads being electrically connected to bumps.

FIG. 20 shows a sagittal cross-section of a GBAW device having a first resonator structure RS1 and a second resonator structure RS2. Electrode structures of both resonator structures are electrically connected to bump connections on the top side of the device. Therefore, through-holes TH are arranged within the layers of the device. The internal surfaces of the through-holes TH are covered by a metallization ME. Thus, an electrical connection between electrode structures of the first resonator structure and the bump connection is achieved by the metallization ME. Further, an electrical connection between electrode structures of the second resonator structure RS2 and a bump connection is established by another metallization ME through another through-hole TH.

Figure 21:
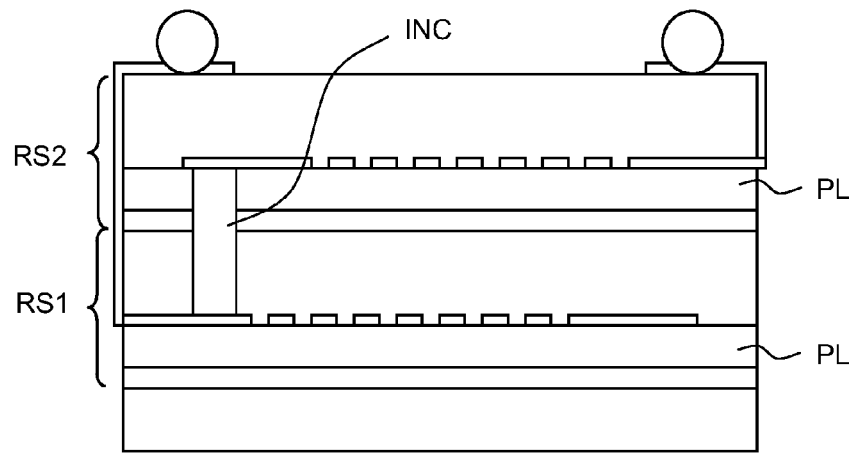
FIG. 21 shows a sagittal cross-section of a GBAW device in which electrodes of stacked resonator structures are electrically connected by means of an internal connection.

FIG. 21 shows a sagittal cross-section of a GBAW device having a first resonator structure RS1 and a second resonator structure RS2. Electrode structures of the first resonator structure and the second resonator structure are electrically connected via an internal connection INC. Such an internal connection can be established by means of a through-hole which is filled with a conducting material like a metal or an alloy.

Figure 22:
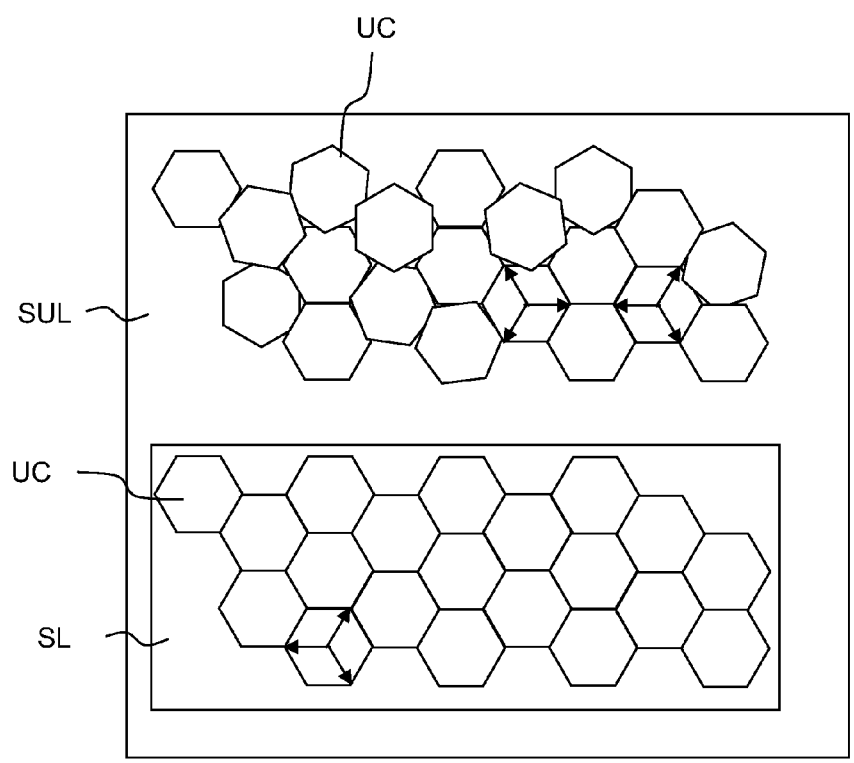
FIG. 22 shows a transverse cross-section of the piezoelectric layer of a GBAW device indicating the effect of a seed layer on the crystalline quality of the piezoelectric layer.

FIG. 22 illustrates the importance of a seed layer SL for achieving good crystalline quality. A transverse cross-section through the piezoelectric layer of a GBAW device is shown. In the upper part of FIG. 22, unit cells UC of a piezoelectric layer are arranged directly on a substrate layer SUL. Although the z-axis of the unit cells, the piezoelectric material may, for instance, be lithium niobate or lithium tantalate, are oriented normal to the surface of the substrate layer SUL some unit cells have an orientation which is rotated around the z-axis. Thus, the in-plane orientation of the unit cells is not ordered perfectly. In comparison, in the lower part of FIG. 22, a seed layer SL is arranged between the substrate layer SUL and the unit cells UC. The seed layer SL helps to arrange the in-plane axis in a well defined pattern of a high translational symmetry as indicated by three arrows within the unit cell.

Figure 23:
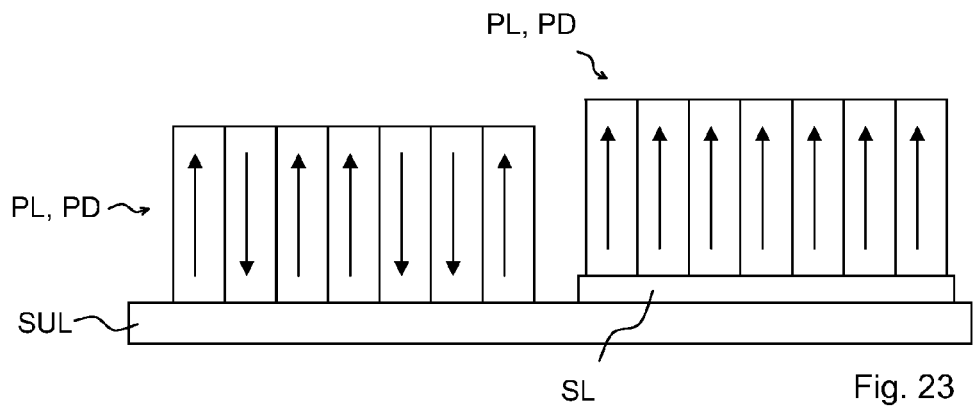
FIG. 23 shows a sagittal cross-section of a GBAW device indicating the effect of a seed layer on the c-axis orientation of the piezoelectric layer.

Accordingly, FIG. 23 shows a sagittal cross-section view of a portion of a piezoelectric layer PL that is deposited directly on a substrate layer SUL (left portion of FIG. 23) and a piezoelectric portion of the piezoelectric layer PL that is deposited on a seed layer SL between the piezoelectric layer PL and a substrate layer SUL (right portion of FIG. 23). Although all piezoelectric axes of the piezoelectric domains PD are arranged normal to the surface of the substrate layer SUL, the portion being deposited directly on the substrate layer SUL contains areas of opposite directions of the piezoelectric domains. However, the piezoelectric layer PL deposited on the seed layer SL only contains one single piezoelectric domain PD of uniform orientation. Thus, the seed layer SL helps to arrange the piezoelectric axis of piezoelectric domains PD in a preferred manner.

Figure 24:
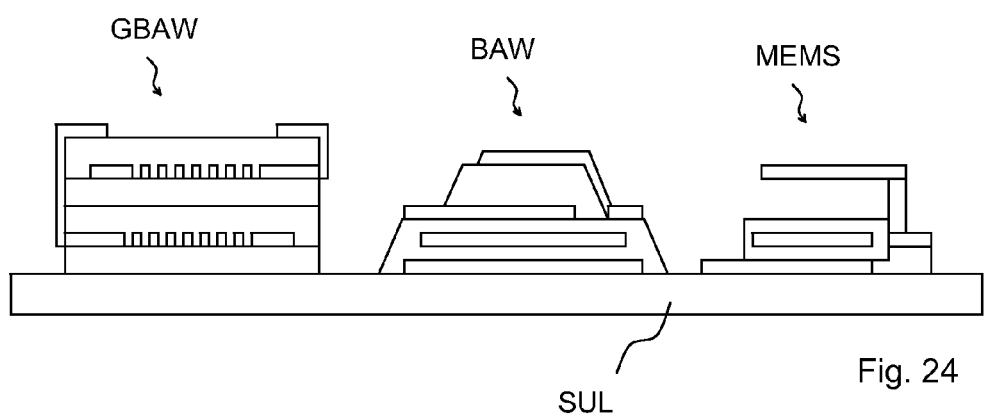
FIG. 24 shows a sagittal cross-section of a GBAW device having three layer stacks including stacked GBAW devices in a first stack, a BAW resonator on a second layer stack and a micro-electromechanical system on a third layer stack.

FIG. 24 shows how the present invention can be combined with conventional filter or switch techniques. The left layer stack denoted by GBAW includes GBAW filters with at least one thin piezoelectric layer. The right layer stack denoted by MEMS includes a MEMS switch. The central layer stack denoted by BAW includes a BAW resonator arranged on an acoustic mirror. The shown combination of elements is an exemplary one. Other combinations may be realized as well.

Similar deposition techniques for filter or switch devices can be utilized. Especially a common substrate layer SUL can be provided in order to deposit the layer stacks onto.

Figure 25:
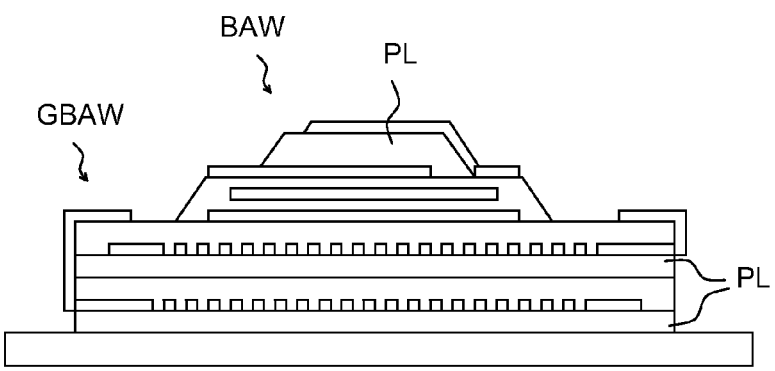
FIG. 25 shows a sagittal cross-section of a GBAW device having a second GBAW resonator structure stacked on a first GBAW resonator structure and having a BAW resonator vertically integrated on the second GBAW resonator structure.

FIG. 25 shows how BAW resonators can be arranged on GBAW resonators or on stacked GBAW resonators. A GBAW device having two resonator structures stacked on each other, each having a piezoelectric layer PL is shown. On top of the GBAW layer stack, a BAW resonator including acoustic mirrors is arranged. The BAW resonator includes a piezoelectric layer PL which is sandwiched between two electrodes.

Thus, combinations of different filter techniques are possible. The advantages of each technique can be utilized, especially the high quality factors Q of BAW resonators.

FIGS. 26a to 26e illustrate how a partial piezoelectric domain inversion yielding stripes of opposite piezoelectric domains is obtained. At first (see FIG. 26a), a piezoelectric layer PL is arranged on a lower electrode EL. It may be preferred that the piezoelectric axis is orientated normal to the surface of the piezoelectric layer. In another step (see FIG. 26b), electrode fingers EF are deposited onto the piezoelectric layer. By applying a strong electric field by heating the layer stack, a piezoelectric domain inversion (see FIG. 26c) can be obtained at those areas where electrode fingers are located on the piezoelectric layer. Further (see FIG. 26d), in another metallization process, a further metallization layer ME is deposited onto the electrode fingers and the free surface of the piezoelectric layer. In a last step (see FIG. 26e), a wave guide layer WL or a temperature compensation layer TCL is deposited onto the upper electrode formed in the previous step. Finally, a radio frequency shield layer RFSL may be deposited onto the wave guide layer or the temperature compensation layer.

FIG. 27 shows a multiplexer MP, for example, for use in mobile communication devices. In one layer stack LS1 of GBAW resonator structures according to the invention, Tx filters of the multiplexer may be arranged. In another layer stack LS2, Rx filters of the multiplexer may be arranged. The respective Tx or Rx filters may include a balun functionality. That is, one kind of port of the multiplexer can be an unbalanced port. These may be antenna ports. The respective other kind of port may include balanced signal lines and may be electrically connected to low noise amplifiers on the receiving side or to power amplifiers on the transmit side.

FIG. 28 shows three horizontal sections A, B, C and five vertically arranged layers I, II, III, IV, and V. Section C shows a sagittal cross-section of a GBAW device. Layer III denotes the piezoelectric layer. Layers II and IV comprise electrodes within electrode layers. The piezoelectric layer includes adjacent stripes of opposite piezoelectric polarization. The horizontal section A of FIG. 28 shows the velocity profile of the velocity of GBAWs propagating in the resonator structure including layers I-V. The respective materials of layers I to V are chosen in such a way that the velocity profile of section A is obtained. The velocity of a GBAW within the piezoelectric layer III is lower than in the layers I and V. The phrase "velocity" denotes the velocity along the GBAW device's acoustic track. The velocity of the GBAWs within the electrode layers II and IV is lower than the velocity within of the piezoelectric layer III. The velocities of layers II and IV may be approximately equal.

In general, the velocity is proportional to $$\sqrt{\frac{c}{\rho}}$$

where c is the stiffness and ρ is the density of the respective material.

Horizontal section B of FIG. 28 shows schematically the GBAW mode. In principle, section B shows the displacement of atoms that are excited within the GBHW.

As one can clearly see, in order to get a well-designed GBAW, the acoustic properties of the materials of all layers I to V have to be chosen carefully.

FIG. 29 also shows three horizontal sections A, B, and C. However, FIG. 29 shows seven vertically arranged layers I-VII. The piezoelectric layer including only one piezoelectric domain, layer IV, is sandwiched between layers II and VI. Electrode fingers defining layers III and V are embedded within layers II and VI as shown in section C.

Section A shows the profile of the GBAWs' velocity which depends on the layer sequence. In layers I and VII the velocity is highest. The velocities in layers II and VI are lower than the velocities in layers I and VII. The velocities along the longitudinal axis X, i.e., along the acoustic track, within layers III and V including the electrode fingers are lower than the velocities in layers II and VI. The velocity in the piezoelectric layer IV is lower than the velocities in layers I and VII but higher than the velocities in layers II and VI.

Again, section B of FIG. 29 schematically indicates the mode of the guided bulk acoustic wave. In contrast to the GBAW mode of FIG. 28, the GBAW mode of FIG. 29 establishes what is called a "piston mode". The GBAW mode of FIG. 29 is a result of the improved tuning possibilities of the velocity profile shown in section A.

Layer I can include silicon nitride, SiN. Layer II can be a temperature compensation layer including silicon dioxide, $SiO_2$. The finger electrodes shown in layers III and V can include gold, Au, while the piezoelectric layer in layer IV can include lithium niobate $LiNbO_3$. Layer VII can comprise silicon nitride SiN or silicon Si.

In general, the acoustic impedance $z=\sqrt{c\rho}$ or a change of the acoustic impedance respectively is relevant for the reflection of acoustic waves, e.g., at lateral ends of the acoustic track. Electrode fingers cause, thus, excitation and reflection of GBAWs.

The present invention includes thin piezoelectric layers within a GBAW device. But the basic concept does not depend on details concerning the arrangement of different layers. Further, the invention is not restricted to the embodiments or the accompanying figures. Especially embodiments including further layers or combinations of different layers are also possible without departing from the invention.

The figures are drawn schematically. Precise dimensions of layers or relative thicknesses of layers cannot be obtained from the figures.

What is claimed is:

1. A guided bulk acoustic wave device comprising:
a substrate layer; and
a first layer stack arranged over the substrate layer,
wherein the first layer stack comprises a first resonator structure with a piezoelectric layer, a first electrode layer for exciting guided bulk acoustic waves, and a waveguide layer
wherein the first electrode layer is arranged between the piezoelectric layer and the waveguide layer,
wherein the piezoelectric layer has a thickness less than or equal to 50 micrometers,
wherein the first electrode layer comprises two electrodes with interdigitated electrode fingers, and
wherein an angle between a piezoelectric axis of the piezoelectric layer and an axis perpendicular to the piezoelectric layer is between 5° and 15°.

2. The device of claim 1, wherein:
the first resonator structure further comprises a second electrode layer,
the piezoelectric layer is arranged between the first electrode layer and the second electrode layer,
the first electrode layer comprises a first electrode and the second electrode layer comprises a second electrode.

3. The device of claim 2, wherein the first electrode comprises an electrode finger and the second electrode comprises an electrode finger.

4. The device of claim 2, wherein the piezoelectric layer comprises stripes of piezoelectric domains arranged one next to another and having alternating orientations of piezoelectric axes.

5. The device of claim 1, wherein the waveguide layer comprises $SiO_2$, SiN, $Al_2O_3$, TiN.

6. The device of claim 1, further comprising a seed layer arranged directly below the piezoelectric layer.

7. The device of claim 6, wherein the seed layer comprises Ti, Al, W, Cu, or Ag.

8. The device of claim 1, wherein the substrate layer comprises monocrystalline or polycrystalline silicon or silicon or a material having a resistivity higher than 500 Ωcm.

9. The device of claim 1, further comprising an isolation layer arranged above the substrate layer.

10. The device of claim 1, further comprising a temperature compensation layer arranged above the piezoelectric layer.

11. The device of claim 10, wherein the temperature compensation layer comprises $SiO_2$ or $TeO_2$.

12. The device of claim 1, further comprising an acoustic absorption layer arranged above or below the first resonator structure.

13. The device of claim 12, wherein the acoustic absorption layer comprises BCB.

14. The device of claim 1, further comprising an RF shield layer comprising a metal.

15. The device of claim 1, further comprising a thermal distribution layer.

16. The device of claim 1, further comprising a high k dielectric layer with an integrated capacitive element.

17. The device of claim 1, further comprising a low k dielectric layer with an integrated inductive element.

18. The device of claim 1, further comprising a second resonator structure with a piezoelectric layer, a first electrode layer for exciting guided bulk acoustic waves, and a waveguide layer, wherein the second resonator structure is arranged within the first layer stack above the first resonator structure.

19. The device of claim 1, further comprising a second layer stack comprising a resonator structure with a piezoelectric layer, a first electrode layer for exciting guided bulk acoustic waves, and a waveguide layer, wherein the first and the second layer stack are arranged above the substrate layer adjacent to each other.

20. The device of claim 19 wherein,
the first layer stack comprises a transmission filter of a duplexer, and
the second layer stack comprises a receiving filter of the duplexer.

21. The device of claim 1, wherein the waveguide layer comprises a material having a ratio $c/\rho$ that is higher than the ratio $c/\rho$ of the material of the piezoelectric layer, where c is a Young's modulus of the material and $\rho$ is a density of the material.

22. The device of claim 1, wherein the waveguide layer comprises a material having a ratio $c/\rho$ that is higher than the ratio $c/\rho$ of the material of the piezoelectric layer, where c is a sheer modulus of the material and $\rho$ is a density of the material.

23. A guided bulk acoustic wave device comprising:
a substrate layer;
a layer stack arranged over the substrate layer, the layer stack comprising:
a first resonator structure comprising a piezoelectric layer, an electrode layer for exciting guided bulk acoustic waves, and a waveguide layer; and
a second resonator structure arranged over the first resonator structure, the second resonator structure comprising a piezoelectric layer, a first electrode layer for exciting guided bulk acoustic waves, and a waveguide layer,
wherein the piezoelectric layer of the first resonator structure or the piezoelectric layer of the second resonator structure has a thickness less than 50 micrometer,
wherein the electrode layer comprises two electrodes with interdigitated electrode fingers, and
wherein an angle between a piezoelectric axis of the piezoelectric layer and an axis perpendicular to the piezoelectric layer is between 5° and 15°.

* * * * *